United States Patent [19]
Gonzalez et al.

[11] Patent Number: 5,717,557
[45] Date of Patent: Feb. 10, 1998

[54] LOW SIDE LINE DRIVER

[75] Inventors: David M. Gonzalez, Elgin; Mark A. Streeter, Northbrook; Stephen R. Tomassetti, Ellhurst, all of Ill.; Roger J. Cook, Livonia, Mich.; Christopher J. Kemp, Monument, Colo.

[73] Assignee: Texas Instruments Incorporated, Dallas, Tex.

[21] Appl. No.: 304,613

[22] Filed: Sep. 12, 1994

Related U.S. Application Data

[63] Continuation of Ser. No. 932,464, Aug. 20, 1992, abandoned.

[51] Int. Cl.⁶ .......................................................... H02H 7/00
[52] U.S. Cl. .............................. 361/18; 361/90; 327/377
[58] Field of Search ................................... 361/18, 89, 90, 361/91; 307/246, 253, 263, 270, 296.4, 296.6, 296.7, 570, 130; 327/376, 377, 380, 382, 387, 478, 530, 545, 534–538, 542

[56] References Cited

U.S. PATENT DOCUMENTS

| | | | |
|---|---|---|---|
| 4,158,866 | 6/1979 | Baker | 361/86 |
| 4,593,206 | 6/1986 | Neidorff et al. | 307/270 |
| 4,843,260 | 6/1989 | Lacy | 307/362 |
| 4,980,576 | 12/1990 | Rossi et al. | 307/270 |
| 5,119,263 | 6/1992 | Gariboldi | 361/18 |
| 5,184,034 | 2/1993 | Ohannes et al. | 307/570 |

Primary Examiner—Jeffrey A. Gaffin
Assistant Examiner—Ronald W. Leja
Attorney, Agent, or Firm—W. Daniel Swayze, Jr.; W. James Brady, III; Richard L. Donaldson

[57] ABSTRACT

A low side line driver (10) includes a slew rate limiter (12) providing current to a pre-charge reference circuit (16). The pre-charge reference circuit (16) generates a constant voltage at the input of a pre-drive circuit (18). Upon a transition to the active state, the pre-charge reference circuit (16) is disabled and current from the slew rate limiter (12) flows to pre-drive circuit (18) which becomes enabled without undue propagation delay or high instantaneous slew rate due to the pre-charge voltage generated by the pre-charge reference circuit (16) before turn on. The pre-drive circuit (18) provides base current to an output driver (22) from a negative voltage created in a charge pump (28). At turn off, an active turn off circuit (26) produces a short output pulse causing rapid discharge of base capacitance of the output driver (22) in order to minimize turn off propagation delay.

3 Claims, 3 Drawing Sheets

LOW SIDE LINE DRIVER

This application is a Continuation of application Ser. No. 07/932,464, filed Aug. 20, 1992, now abandoned.

TECHNICAL FIELD OF THE INVENTION

This invention relates in general to integrated circuit devices and more particularly to a low side line driver.

BACKGROUND OF THE INVENTION

Low side line drivers have typically been constructed using one of two transistor technologies, either CMOS or bipolar. Both types of technologies provide certain advantages and disadvantages that enhance or limit operation and construction of low side line drivers. The present state of the art bipolar or CMOS low side line driver implementations are generally intolerant to output short circuits to potentials more negative than substrate voltage due to excessive current flow and/or latchup caused by forward biased isolation junctions. Additionally, present high output current drivers do not afford low quiescent or very low power down supply current operation. Previously developed low side line drivers do not address the simultaneous needs for very low output voltage at high output current, accurate slew rate control, and tolerance to output DC fault conditions. It is thus desirable to exploit the advantages of both bipolar and CMOS transistor technologies in order to provide a controlled, efficient, and robust low side line driver.

From the foregoing, it may be appreciated that a need has arisen for a low side line driver which achieves the advantages of both bipolar and CMOS transistor technologies and eliminates their disadvantages. A need has also arisen for a low side line driver that has very low output voltage and high output current, accurate slew rate control, and tolerance to fault conditions.

SUMMARY OF THE INVENTION

In accordance with the present invention, a low side line driver is provided which substantially eliminates or reduces disadvantages and problems associated with prior art low side line drivers.

The present invention includes a slew rate limiter generating a constant current and providing slew rate control. A pre-charge reference generates a constant voltage in response to this constant current and provides the constant current to a pre-drive circuit to ensure that the pre-drive circuit conducts current upon activation in order to minimize turn on propagation delay. An output driver generates a low level slew rate limited output signal in response to current from the pre-drive circuit. A charge pump provides a negative voltage supply for the pre-drive circuit in generating base current for the output driver. An active turn off circuit disables the output driver with minimum turn off propagation delay by rapidly discharging base capacitance of the output driver.

The present invention provides various technical advantages over other low side line drivers within the prior art. For example, one technical advantage is in implementing both bipolar and CMOS transistor technologies to take advantage of the benefits of each technology. Another technical advantage is in providing a low side line driver which achieves very low output voltage at high output current, accurate slew rate control, and tolerance to fault conditions. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
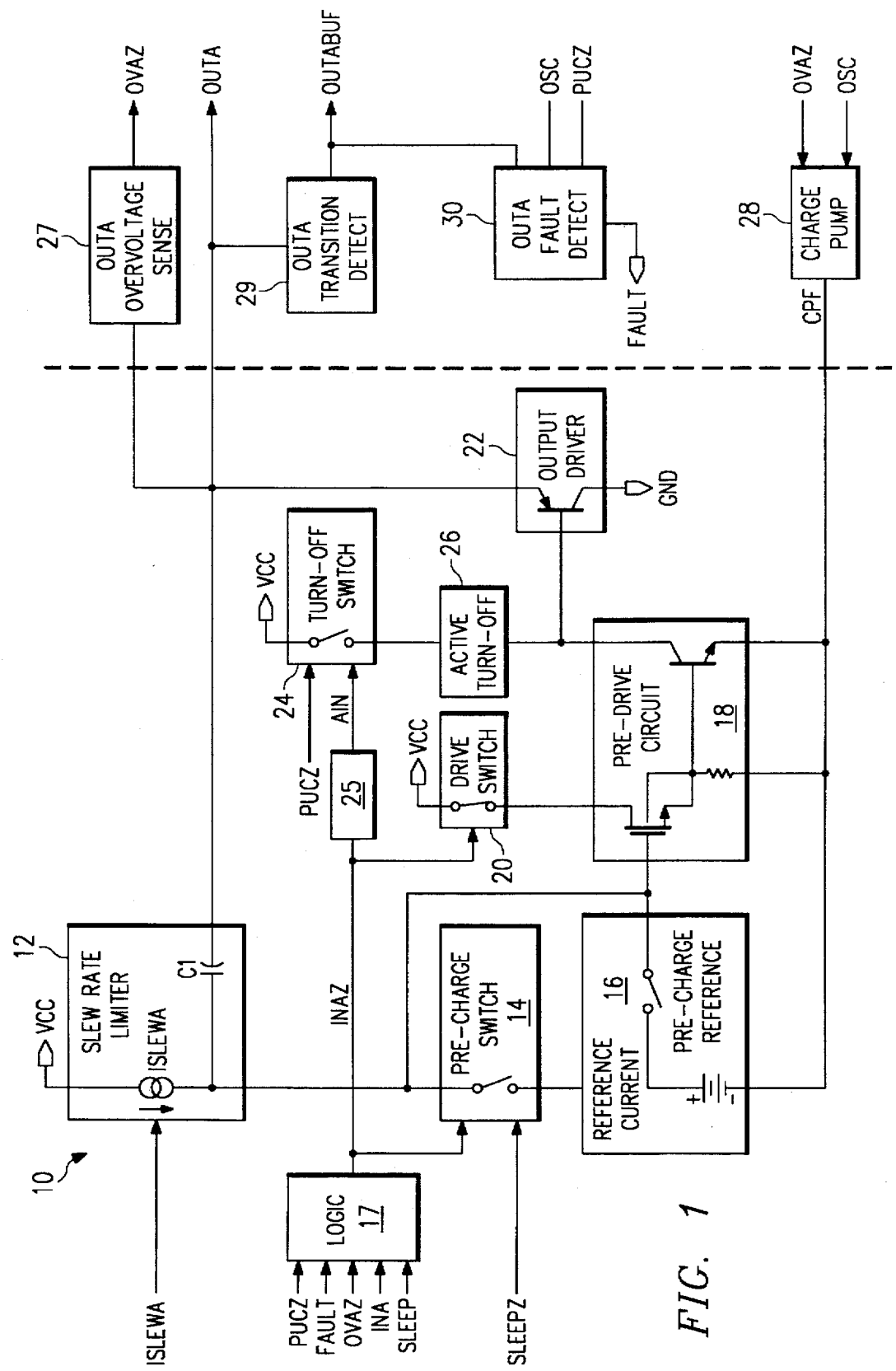
FIG. 1 illustrates a block diagram of a preferred low side line driver.

FIG. 1 is a block diagram of a preferred low side line driver 10. Low side line driver 10 includes a slew rate limiter block 12 coupled to a pre-charge switch block 14 and a pre-charge reference block 16. Logic block 17 provides input signal INAZ to pre-charge switch block 14. Slew rate limiter block 12 and pre-charge reference block 16 couple to a pre-drive circuit block 18. Pre-drive circuit block 18 is controlled-by input signal INAZ through a drive switch block 20. Pre-drive circuit block 18 couples to an output driver block 22 which generates an output signal OUTA. A turn off switch block 24 receives a signal AIN from pulsed inverter block 25 and drives an active turn off block 26 which couples to output driver block 22. A separate OUTA overvoltage sense block 27 couples to output signal OUTA and provides an overvoltage signal OVAZ to logic block 17 and a charge pump block 28. Charge pump block 28 provides a negative voltage signal CPF to pre-charge reference block 16 and pre-drive circuit block 18. A separate OUTA transition detect block 29 couples to output signal OUTA and provides signal OUTABUF used to control signals SLEEPZ and FAULT. A separate OUTA fault detect block 30 couples to OUTA transition detect block 29 to produce signal FAULT. A supply voltage VCC and a neutral voltage GND couple to various portions of low side line driver 10.

In operation, pre-charge switch block 14 is closed, causing ISLEWA current to flow into pre-charge reference block 16, prior to the closing of drive switch block 20. Pre-charge reference block 16 provides pre-drive circuit block 18 with a constant voltage to insure that pre-drive circuit block 18 conducts a controlled amount of current at turn on. In this manner, excessive propagation delay or high instantaneous slew rate at turn on is eliminated. At turn on, pre-charge switch block 14 opens and drive switch block 20 enables pre-drive circuit block 18 that combines with output driver block 22 to form a transconductance amplifier with C1 connected as a feedback element. The ISLEWA current from slew rate limiter block 12 provides a constant input current to pre-drive circuit block producing a constant slew rate voltage at output signal OUTA. The low level output voltage required at output signal OUTA is created through charge pump block 28. Charge pump block 28 creates a negative internal supply voltage CPF that is used by pre-drive circuit block 18 to supply base current to output driver block 22, driving its base to a negative voltage and thus reducing the low level output voltage.

Turn off switch block 24 and active turn off block 26 insure rapid turn off of output driver block 22 by producing a short output pulse and rapidly discharging the base capacitance of output driver block 22, minimizing turn off propagation delay. OUTA Overvoltage sense block 27 monitors the voltage of output signal OUTA and generates an overvoltage signal OVAZ when an overvolt condition occurs. Overvoltage signal OVAZ disables output driver block 22 through logic block 17 and drive switch block 20. Overvoltage signal OVAZ also disables charge pump block 28. OUTA transition detect block 29 produces a logic level signal OUTABUF whose transitions keep line driver 10 from entering a low power sleep mode through signal SLEEPZ. Signal OUTABUF is used by OUTA fault detect block 30 to determine if a low impedance short has occurred on OUTA. If so, line driver 10 is disabled by signal FAULT.

Figure 2A:
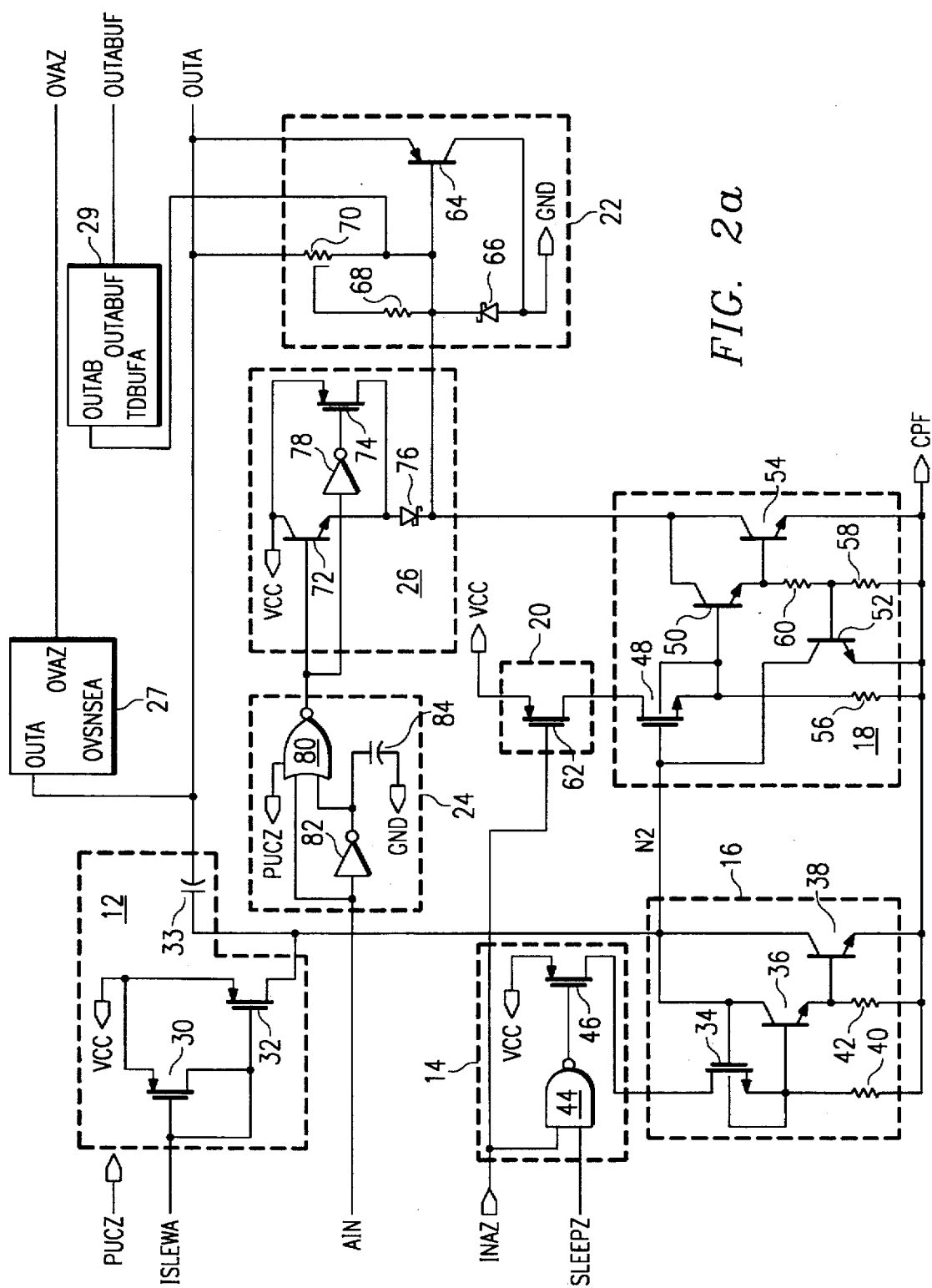
FIGS. 2a–b illustrate schematic diagrams of the preferred low side line driver.

FIG. 2a is a schematic diagram of the preferred low side line driver 10 with OUTA overvoltage sense block 27 and OUTA transition detect block 29. Low side line driver 10 includes slew rate limiter block 12 comprising CMOS transistors 30 and 32, which receive a current source input signal ISLEWA from a voltage current reference circuit, and C1 capacitor 33. Slew rate limiter block 12 couples to pre-charge reference block 16 comprising CMOS transistor 34, bipolar transistors 36 and 38, and resistors 40 and 42. Pre-charge reference block 16 activates through pre-charge switch block 14 comprising NAND gate 44 and CMOS transistor 46. Pre-charge reference block 16 couples to pre-drive circuit block 18 comprising CMOS transistor 48, bipolar transistors 50, 52, and 54, and resistors 56, 58, and 60. Pre-drive circuit block 18 activates through drive switch block 20 comprising CMOS transistor 62. Logic block 17 is not shown here.

Pre-drive circuit block 18 couples to output driver block 22 comprising bipolar transistor 64, Schottky diode 66, and resistors 68 and 70. Output driver block 22 couples to active turn off block 26 comprising bipolar transistor 72, CMOS transistor 74, Schottky diode 76, and inverter 78. Active turn off block 26 couples to turn off switch block 24 comprising NOR gate 80, inverter 82, and capacitor 84. Turn off switch block 24 receives an input signal AIN which is the logical compliment of input signal INAZ. Output driver block 22 generates output signal OUTA which couples to OUTA overvoltage sense block 27 and OUTA transition detect block 29, each generating output signals OVAZ and OUTABUF, respectively. Charge pump block 28 of FIG. 1 provides a negative voltage charge pump signal CPF to pre-charge reference block 16 and pre-drive circuit block 18.

In operation, CMOS transistor 34 and bipolar transistors 36 and 38 of pre-charge reference block 16 are designed to mimic CMOS transistor 48 and bipolar transistors 50 and 54 of pre-drive circuit block 18. Bipolar transistor 52 provides a current limiting function within pre-drive circuit block 18 to minimize charge pump loading after slewing is complete. Pre-charge reference block 16 sets out a voltage at signal N2 which approximates a voltage during slew when output driver block 22 is enabled. Prior to turn on, CMOS transistor 46 of pre-charge switch block 14 conducts to allow pre-charge reference block 16 to place the pre-charged voltage on signal N2. In this state, CMOS transistor 62 of drive switch block 20 and bipolar transistors 50 and 54 of pre-drive circuit block 18 are off, placing output driver 22 in the high impedance state.

As input signal INAZ goes active low, CMOS transistor 62 of drive switch block 20 turns on, subsequently turning on bipolar transistors 50 and 54 of pre-drive circuit block 18. Base current conducts from bipolar transistor 64 of output driver block 22 down to charge pump signal CPF. CMOS transistor 46 of pre-charge switch block 14 turns off, placing pre-charge reference block 16 in the high impedance state to allow for slew rate control through slew rate limiter block 12. CMOS transistor 32 of slew rate limiter block 12 charges signal N2 at the desired slew rate output. Since signal N2 was pre-charged prior to turn on, pre-drive circuit block 18 turns on without any excessive propagation delay or instantaneous slew rate. If the slew rate is too fast, the voltage at signal N2 is pulled down through capacitor 33 to slow down output driver block 22. If the slew rate is too slow, CMOS transistor 32 charges capacitor 33 faster to force output driver block 22 to turn on harder.

With input signal INAZ at active low, active turn off block 26 is disabled and the output voltage level at output signal OUTA is approximately 0.3 volts. When input signal INAZ transitions to its inactive high state, CMOS transistor 62 of drive switch block 20 and bipolar transistors 50 and 54 of pre-drive circuit block 18 turn off. Active turn off block 26 provides a current pulse set by the drive strength of inverter 82 and capacitor 84 of turn off switch block 24. This pulse is injected into the base of bipolar transistor 64 of output driver block 22, rapidly discharging its capacitance and minimizing turn off propagation delay. Output signal OUTA transitions to the high impedance state. Active turn-off block 26 provides a pulse of current as opposed to a constant current to maximize OUTA output impedance while the driver is off.

Schottky diode 76 protects bipolar transistor 72 and CMOS transistor 74 from destruction when necessary due to a positive overvolt condition on output signal OUTA. Schottky diode 66 protects bipolar transistor 64 due to a negative overvolt condition by preventing output driver block 22 from turning on. Schottky diode 66 also prevents bipolar transistor 64 from entering deep saturation, thus minimizing turn-off delay. OUTA overvoltage sense block 27 inhibits output driver block 22 through overvoltage signal OVAZ whenever a positive overvolt condition occurs. OUTA overvoltage sense block 27 disables low side line driver 10 whenever the voltage on output signal OUTA is more positive than a predetermined threshold level. OUTA transition detect block 29 generates a logic level output signal OUTABUF for use by a separate sleep timer in generating signal SLEEPZ and OUTA fault detect block 30 in generating signal FAULT.

To minimize power consumption during periods of inactivity, low side line driver 10 may enter into a low power sleep mode. OUTA transition detect block 29 monitors active edge transitions on output signal OUTA and produces an activity signal OUTABUF. Each active edge resets the separate sleep timer keeping all circuits powered up. If the sleep timer detects inactivity on activity signal OUTABUF for a predetermined time period, the sleep timer generates signal SLEEPZ and SLEEP to power down all low side line driver 10 circuits. SLEEP is the logical complement of signal SLEEPZ. A subsequent active edge transition resets the sleep timer and powers up the driver.

OUTA fault detect block 30 of FIG. 1 monitors the transition activity of output signal OUTA to determine whether low side line driver 10 can successfully drive output signal OUTA to a valid low logic level. OUTA transition detect block 29 provides OUTA fault detect block 30 with a transition activity signal OUTABUF. If output signal OUTA remains above a pre-determined threshold level for more than a pre-determined time interval, a fault condition occurs. OUTA fault detect block 30 generates a fault signal FAULT which disables low side line driver 10 by overriding input signal INA at logic block 17, forcing input signal INAZ to its inactive high state. Low side line driver 10 remains disabled for a pre-determined time period before OUTA fault detect block 30 repeats monitoring of output signal OUTA transition activity. This mechanism restricts the on time duty cycle of low side line driver 10, limiting power dissipation in the driver to a safe level.

Figure 2B:
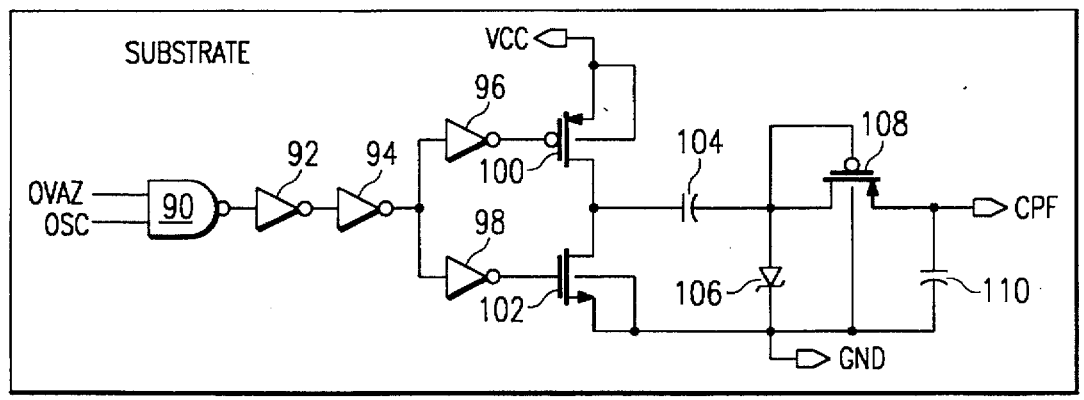

FIG. 2b is a schematic diagram of charge pump block 28. Charge pump block 28 includes a NAND gate 90 coupled to an inverter 92. Inverter 92 couples to inverter 94 which provides a signal to inverter 96 and inverter 98. Inverter 96 couples to CMOS transistor 100. Inverter 98 couples to CMOS transistor 102. CMOS transistors 100 and 102 couple to a capacitor 104 which feeds a Schottky diode 106 and a CMOS transistor 108. Charge pump signal CPF is generated at the source of CMOS transistor 108 and a capacitor 110. Charge pump employs Schottky diode 106 and CMOS transistor 108 instead of bipolar junction diodes to realize operation at voltages more negative than substrate potential.

Circuit construction is such that when a short circuit occurs on OUTA, either a positive or a negative voltage to specified levels, the circuit will limit current flow and thus enable the driver to survive.

Figure 3:
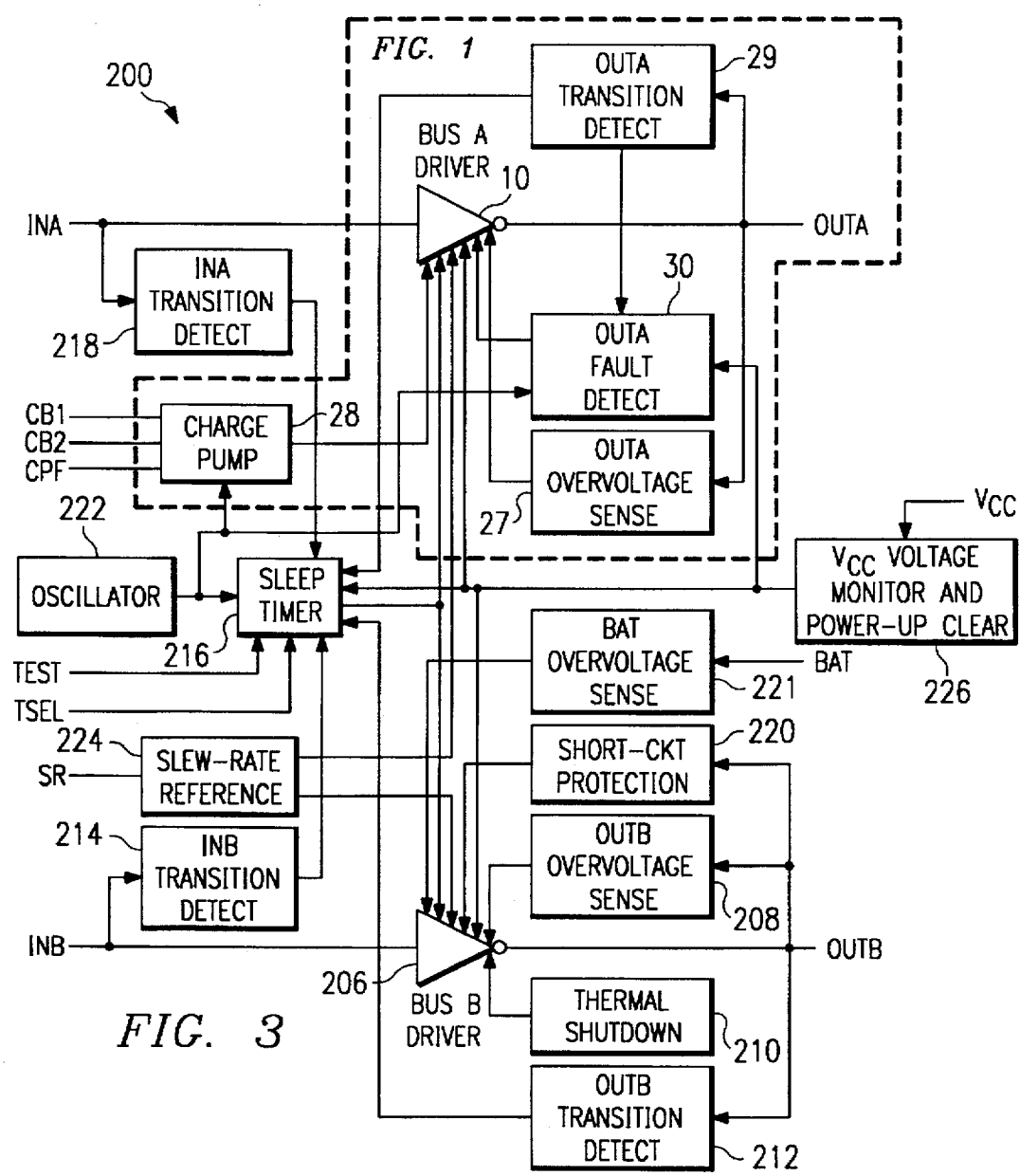
FIG. 3 illustrates a block diagram of a differential line driver implementing the preferred low side line driver.

FIG. 3 is a block diagram of a differential line driver 200 implementing low side line driver 10. Differential line driver 200 includes low side line driver 10 coupled to OUTA overvoltage sense block 27, OUTA transition detect block 29, OUTA fault detect block 30, and charge pump block 28. Differential line driver 200 also includes a high side line driver 206 coupled to an OUTB overvoltage sense block 208 and a thermal shutdown block 210. High side line driver 206 couples to an OUTB transition detect block 212 and an INB transition detect block 214, both coupled to a sleep timer block 216. Similarly, low side line driver 10 couples to OUTA transition detect block 29 and an INA transition detect block 218 which provide signals to sleep timer block 216. High side line driver 206 also couples to a short circuit protection block 220 and a battery overvoltage sense block 221. An oscillator block 222 provides a clock signal to charge pump block 28, sleep timer block 216, and OUTA fault detect block 30. A slew rate reference block 224 provides current source reference signals to both high side line driver 206 and low side line driver 10. A voltage monitor and power clear block 226 provides signals to high side line driver 206, low side line driver 10, sleep timer block 216, and OUTA fault detect block 30.

In operation, differential line driver 200 uses complementary but fully independent high side and low side line drivers to achieve a superior level of performance and reliability. Output voltage slew rates for both high side and low side line drivers are controlled by a single slew rate reference block 224. Numerous fault detection circuits protect the drivers from overdissipation due to external bus or power supply fault conditions. By having independent low side and high side line driver operation, single ended transmission of one line driver may continue in the event of a fault disabling the other line driver.

Low side line driver 10, charge pump block 28, OUTA overvoltage sense block 27, OUTA transition detect block 29, and OUTA fault detect block 130 operate as previously described above. High side line driver 206 provides a high level high current output signal OUTB when activated by input signal INB. Fault detection for high side line driver 206 occurs through OUTB overvoltage sense block 208, short circuit protection block 220, battery overvoltage sense block 221, and thermal shutdown block 210. OUTB overvoltage sense block 208 disables high side line driver 206 if the voltage on output signal OUTB is more negative than a predetermined threshold. Short circuit protection block 220 limits the driver's peak instantaneous output current on output signal OUTB. Battery overvoltage sense block 221 detects battery voltages higher than expected maximum operating voltage and disables high side line driver 206 if battery voltage exceeds a pre-determined threshold. Thermal shutdown block 210 senses junction temperature and disables high side line driver 206 if a pre-determined thermal threshold is exceeded. Hysteresis within thermal shutdown block 210 causes high side line driver 206 to enable and disable at a low rate, limiting maximum junction temperature to a safe level.

Slew rate control is established by slew rate reference block 224 and slew rate limiters within each line driver. Slew rate reference block 224 creates matched control currents for each line driver. Slew rate limiters within each line driver integrate the matched control currents to produce complementary slew rate limited signals at output signals OUTA and OUTB.

Sleep timer block 216 is used to minimize power consumption during idle bus conditions. OUTB transition detect block 212, INB transition detect block 214, OUTA transition detect block 29, and INA transition detect block 218 monitor bus activity by detecting active edge transitions on input signals INA and INB and output signals OUTA and OUTB. Each active edge resets sleep timer block 216, keeping all circuits powered. If there are no active edges on an input or output for either high side or low side line driver after a predetermined time period, sleep timer block 216 powers down all circuits, except for voltage monitor circuit 226, in order to reduce power consumption. During sleep mode, the individual line drivers are disabled and present high impedance on their respective output signals. The transition detect blocks remain active but do not draw any supply current. A subsequent detection of an active edge on any input or output pin resets sleep timer block 216 and powers up both line drivers.

Voltage monitor and power up clear block 226 ensures that differential line driver 200 powers up in the normal full power state ready for data transmission. Clear signals are provided to sleep timer block 216 and OUTA fault detect block 30 to ensure that the device is awake, enabled, and in the proper logic state. Clear signals are also provided to both line drivers to momentarily inhibit each driver ensuring that they present a high impedance to the bus during power up in order to eliminate the possibility of power on glitches caused by indeterminant logic levels. Voltage monitor and power up clear block 226 also generates a clear signal if the supply voltage VCC falls below a specified threshold. This feature prevents bus glitches and erratic operation of the line drivers during a permanent or temporary loss of power.

In summary, the pre-charge reference circuit of the low side line driver, supplied by the slew rate limiter circuit, provides a constant voltage at an input to the pre-drive circuit. The pre-charge reference circuit prevents excessive propagation delay or high instantaneous slew rate at driver turn on, since the input to the pre-drive circuit is pre-charged to near the slew rate voltage. At turn on, the pre-charge reference circuit is disabled, forcing the slew current to flow into the pre-drive circuit instead of the pre-charge reference circuit. Once enabled, the pre-drive circuit supplies base current, generated by a negative internal voltage supply created by a charge pump, to the output driver. At turn off, an active turn off circuit produces a short output pulse to cause the base capacitance of the output driver to rapidly discharge in order to minimize turn off propagation delay. An overvoltage sensor is provided to detect positive overvolt and inhibit the output driver and the charge pump. A transition detector produces a signal whose transitions keep the line driver from entering a low power sleep mode and to provide fault indications to disable the line driver.

Thus, it is apparent that there has been provided, in accordance with the present invention, a low side line driver that satisfies the objects, aims, and advantages set forth above. Although the preferred embodiment has been described in detail, it should be understood that various changes, substitutions, and alterations can be made herein. For example, many of the direct connections illustrated herein could be altered by one skilled in the art such that two elements are merely coupled to one another through an intermediate element or elements without being directly connected as illustrated in the preferred embodiment. Other examples are readily ascertainable by one skilled in the art and could be made without departing from the spirit and scope of the invention as defined by the following claims.

What is claimed is:

1. A combined bipolar and complementary metal oxide semiconductor, CMOS, low side line driver formed on a substrate, comprising:

an output driver bipolar transistor;

a predrive circuit connected to the output driver bipolar transistor, the predrive circuit including a CMOS transistor connected to a bipolar transistor; and a charge pump circuit coupled to the predrive circuit to provide a negative voltage with respect to the substrate to the predrive circuit, the charge pump circuit including a CMOS transistor and a schottky diode.

2. The low side driver of claim 1 further comprising:

a precharge reference circuit connected to the predrive circuit, the precharge reference circuit including a CMOS transistor connected to a bipolar transistor.

3. The low side driver of claim 2 further comprising:

a slew rate limiter circuit connected to precharge reference circuit, the slew rate limiter circuit including a CMOS transistor.

\* \* \* \* \*